United States Patent
Eloranta et al.

(10) Patent No.: US 7,812,751 B2
(45) Date of Patent: Oct. 12, 2010

(54) METHOD AND DEVICE FOR DIGITAL-TO-ANALOG CONVERSION WITH FILTERING

(75) Inventors: Petri T. Eloranta, Espoo (FI); Pauli Seppinen, Vantaa (FI); Aarno Pärssinen, Espoo (FI)

(73) Assignee: Nokia Corporation, Espoo (FI)

( * ) Notice: Subject to any disclaimer, the term of this patent is extended or adjusted under 35 U.S.C. 154(b) by 279 days.

(21) Appl. No.: 11/904,510

(22) Filed: Sep. 26, 2007

(65) Prior Publication Data

US 2009/0195425 A1   Aug. 6, 2009

(51) Int. Cl.
  *H03M 1/66* (2006.01)
(52) U.S. Cl. .................................. 341/144; 341/136
(58) Field of Classification Search ................. 341/144
  See application file for complete search history.

(56) References Cited

U.S. PATENT DOCUMENTS

| | | | | |
|---|---|---|---|---|
| 5,880,689 | A * | 3/1999 | Kushner | 341/144 |
| 6,816,097 | B2 * | 11/2004 | Brooks et al. | 341/143 |
| 6,937,848 | B2 * | 8/2005 | Eloranta et al. | 455/118 |
| 7,132,969 | B2 * | 11/2006 | Fuchs et al. | 341/144 |
| 2005/0225464 | A1 | 10/2005 | Lin et al. | 341/144 |
| 2005/0225472 | A1 | 10/2005 | Schoner | 341/166 |

FOREIGN PATENT DOCUMENTS

WO   WO-2007/090929 A1   8/2007

OTHER PUBLICATIONS

Li, Yee, et al., "A Continuous-Time Programmable Digital FIR Filter", IEEE Journal of Solid-State Circuits, vol. 41, No. 11, Nov. 2006, pp. 2512-2520.
Eloranta, P., et al., "A WCDMA Transmitter in 0.13μm CMOS Using Direct-Digital RF Modulator", IEEE International Solid-State Circuits Conference, Feb. 2007, pp. 340-341, 607.
Mercer, D. "Low-Power Approaches to High-Speed Current-Steering Digital-to-Analog Converters in 0.18-μm CMOS", IEEE Journal of Solid-State Circuits, vol. 42, No. 8, Aug. 2007, pp. 1688-1698.
Eloranta, P., et al., "Direct-digital RF modulator IC in 0.13μm CMOS for Wideband Multi-Radio Applications". IEEE International Solid-State Circuits Conference 2005, 4 pgs.

* cited by examiner

*Primary Examiner*—Khai M Nguyen
(74) *Attorney, Agent, or Firm*—Harrington & Smith

(57) ABSTRACT

The invention relates to a device and a method for converting a digital signal having a plurality of data-bits into a filtered analog signal. A device according to the invention includes a delay element arranged to produce one or more differently delayed version of the digital signal and a digital-to-analog conversion circuitry arranged to convert the digital signal and the one or more differently delayed, and possibly differently scaled, versions of the digital signal into analog signals and to produce the filtered analog signal as a combination of the analog signals. Therefore, the device constitutes not only a digital-to-analog-converter but also a finite impulse response filter.

19 Claims, 8 Drawing Sheets

METHOD AND DEVICE FOR DIGITAL-TO-ANALOG CONVERSION WITH FILTERING

FIELD OF THE INVENTION

The invention relates to a digital-to-analog converter and, more particularly, to a device and a method for converting a digital signal having a plurality of data-bits into a filtered analog signal.

BACKGROUND

In many digital radio communication systems a digital signal having a plurality of data-bits is converted into an analog signal that contains substantially the same information as the original digital signal. A noise floor after the digital-to-analog conversion is typically defined by quantization noise and digital noise. The digital noise is a difference between an ideal digital signal and the actual digital signal. The quantization noise is a difference between a corresponding ideal analog signal, i.e. a signal with unlimited bit accuracy, and the ideal digital signal. In many applications it is required that a power spectral density (Watts/Hz) of out-of-band noise that appears on a certain frequency region that is located in the neighbourhood of a frequency band of the digital-to-analog converted signal does not exceed a specified limit. For example, in a WCDMA-system (Wide band Code Division Multiple Access) out-of-transmission band noise resulting in conjunction with generation of an analog transmission (TX) signal should not be too strong at a frequency band on which a reception signal (RX) of the WCDMA-system is located in the frequency domain. As WCDMA-systems use a full-duplex data transfer scheme there are demanding requirements for the out-of-transmission band noise that is generated as a side-effect of the transmission (TX) to the frequency band of the reception signal (RX).

In a typical solution according to the prior art, the out-of-band noise is attenuated with one or more analog filters that is/are arranged to have a stop-band/stop-bands in desired frequency regions in the neighbourhood of a frequency band of a digital-to-analog converted signal. An analog filter is a feasible solution for systems in which there is an analog base-band signal. In a system of this kind an analog low-pass filter (LPF) can be located between an output terminal of a digital-to-analog converter and an input terminal of an up-modulation circuitry that is arranged to mix the analog base-band signal to a desired frequency band. In some systems, however, there is no analog base-band signal. An example of a system of this kind is a radio transmitter having a digital-to-radio frequency converter (DRFC) that is arranged to perform not only a digital-to-analog conversion but also an up-modulation. In principle, an analog band-pass filter (BPF) could be used for attenuating the out-of-band noise. An analog band-pass filter can be a feasible solution for e.g. a DSL-modem that operates on a frequency range extending up to at most 2-16 MHz depending on a line-code being used. In conjunction with a mobile phone application that operates at a gigahertz range it can be, however, a too challenging task to realize a cost effective and sufficiently small analog filter the frequency response of which could have sufficiently sharp (dB/Hz) transitions between pass-bands and stop-bands.

SUMMARY

In accordance with a first aspect of the invention, there is provided a new device for converting a digital signal having a plurality of data-bits into a filtered analog signal. The device comprises:

a delay element arranged to produce a delayed version of said digital signal, and a digital-to-analog conversion circuitry arranged to convert said digital signal into a first analog signal, to convert said delayed version of said digital signal into a second analog signal, and to produce the filtered analog signal as a combination of said first analog signal and said second analog signal.

The wording "delayed version" is an open definition in a sense that the delayed version of the digital signal can be, in addition to being delayed, also otherwise modified, for example digitally filtered, with respect to the digital signal.

The device constitutes not only a digital-to-analog-converter but also a finite impulse response filter (FIR-filter). The FIR-filter can be tuned to generate a spectral null at a desired frequency by adjusting a temporal length of the delay produced, with the delay element.

In a device according to an embodiment of the invention the delay element can be arranged to produce two or more differently delayed versions of said digital signal and the digital-to-analog conversion circuitry can be arranged to convert said digital signal and the two or more differently delayed, and possibly differently scaled, versions of said digital signal into analog signals and to produce the filtered analog signal as a combination of the above-mentioned analog signals. Therefore, the device according to an embodiment of the invention can be arranged to constitute a FIR-filter that has more than two tap coefficients and is able to generate more than one spectral null.

The digital-to-analog conversion circuitry can be either an ordinary digital-to-analog conversion circuitry that is arranged to perform only digital-to-analog conversion or a digital-to-analog conversion circuitry that is arranged to perform not only digital-to-analog conversion but also up-modulation. An example of a digital-to-analog conversion circuitry that is able to perform also up-modulation is described e.g. in a document: Petri Eloranta, Pauli Seppinen; *Direct-Digital RF-modulator IC in 0.13 µm CMOS for Wideband Multi-Radio Applications*, IEEE International Solid-State Circuits Conference 2005.

In accordance with a second aspect of the invention, there is provided a new communication device. The communication device comprises:

a delay element arranged to produce a delayed version of a digital signal, and a digital-to-analog conversion circuitry arranged to convert said digital signal into a first analog signal, to convert said delayed version of said digital signal into a second analog signal, and to produce a filtered analog signal as a combination of said first analog signal and said second analog signal.

In accordance with a third aspect of the invention, there is provided a new set of integrated circuits for converting a digital signal having a plurality of data-bits into a filtered analog signal. The set of integrated circuits comprises the following elements realized in one or more integrated circuit:

a signal input interface arranged to receive said digital signal, a delay element arranged to produce a delayed version of said digital signal, and a digital-to-analog conversion circuitry arranged to convert said digital signal into a first analog signal, to convert said delayed version of said digital signal into a second analog signal, and to produce the filtered analog signal as a combination of said first analog signal and said second analog signal.

In accordance with a fourth aspect of the invention, there is provided a new method for converting a digital signal having a plurality of data-bits into a filtered analog signal. The method comprises:

producing a delayed version of said digital signal,
converting said digital signal into a first analog signal,
converting said delayed version of said digital signal into a second analog signal, and
producing the filtered analog signal as a combination of said first analog signal and said second analog signal.

A benefit provided by embodiments of the present invention when compared with prior art solutions of the kind described earlier in this document is that the implementation of a solution according to an embodiment of the invention is done in the digital domain making it relatively easy and the solution according to an embodiment of the invention lowers requirements that fall on analog filtering of e.g. a transmitter of a communication device.

Various embodiments of the invention both as to constructions and to methods of operation, together with additional objects and advantages thereof, will be best understood from the following description of specific embodiments when read in connection with the accompanying drawings.

The embodiments of the invention presented in this document are not to be interpreted to pose limitations to the applicability of the appended claims. The verb "to comprise" is used in this document as an open limitation that does not exclude the existence of also unrecited features. The features recited in depending claims are mutually freely combinable unless otherwise explicitly stated.

BRIEF DESCRIPTION OF FIGURES

Embodiments of the invention presented in the sense of examples and their advantages are explained in greater detail below with reference to the accompanying drawings, in which FIG. 2b shows a circuit diagram of a conversion cell of a digital-to-analog conversion circuitry that can be used in a device shown in FIG. 2a.

FIG. 3b shows a circuit diagram of a conversion cell of a digital-to-analog conversion circuitry that can be used in a device shown in FIG. 3a.

DETAILED DESCRIPTION OF THE EMBODIMENTS

A device according to an embodiment of the invention comprises: (i) means for producing a delayed version of a digital signal, (ii) means for converting the digital signal into a first analog signal, (iii) means for converting the delayed version of the digital signal into a second analog signal, and (iv) means for producing a filtered analog signal as a combination of the first analog signal and the second analog signal.

Figure 1A:
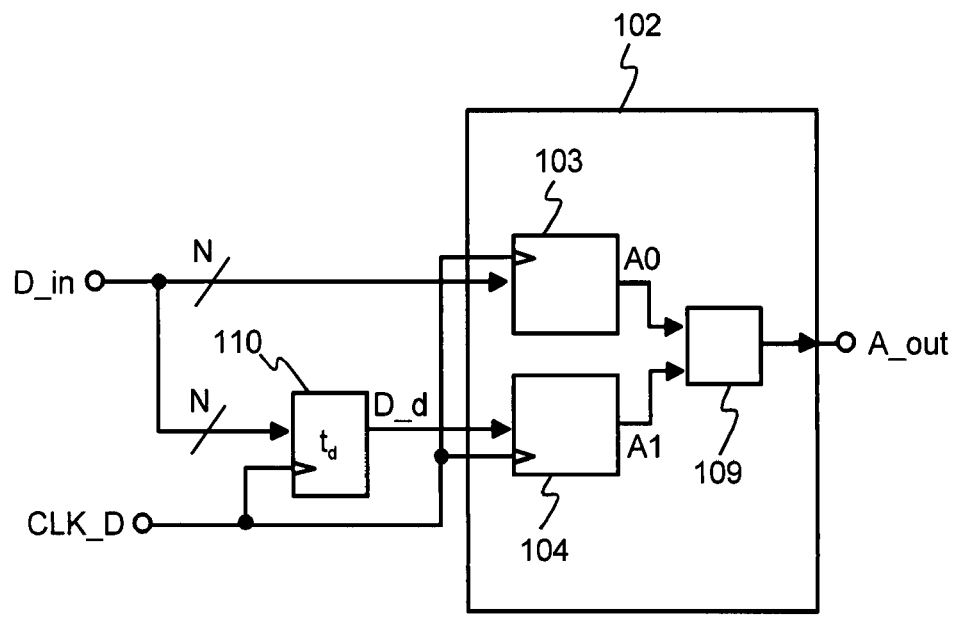
FIGS. 1a and 1b show high level block diagrams of devices according to embodiments of the invention for converting a digital signal having a plurality of data-bits into a filtered analog signal.

FIG. 1a shows a block diagram of a device according to an embodiment of the invention for converting a digital signal D_in having N data-bits into a filtered analog signal A_out. The device comprises a delay element 110 that is arranged to produce a delayed version D_d of the digital signal D_in. A digital-to-analog conversion circuitry 102 comprises conversion elements 103 and 104 and a combination element 109. The conversion element 103 is arranged to convert the digital signal D_in into a first analog signal A0. The conversion element 104 is arranged to convert the delayed version D_d of the digital signal into a second analog signal A1. The combination element 109 is arranged to produce the filtered analog signal A_out as a combination of the first analog signal A0 and the second analog signal A1. In a case in which the analog signals A0 and A1 are represented with electrical currents and the filtered analog signal A_out is the sum of A0 and A1, the combination element 109 can be just a point of contact of electrical wires. With an operational amplifier and resistors it is possible to build a combination element that is arranged to form e.g. a weighted sum of the analog signals A0 and A1.

In a device according to an embodiment of the invention the digital-to-analog conversion circuitry 102 is arranged to convert the digital signal D_in into the first analog signal A0 with a first digital-to-analog ratio r0 and to convert the delayed version D_d of the digital signal into the second analog signal A1 with a second digital-to-analog ratio r1. In this document a digital-to-analog ratio means an "input level/output level—ratio" of digital-to-analog conversion. The digital-to-analog ratio r0 indicates a value of A0 that corresponds with a given digital value, i.e. a given bit configuration, of D_in. Correspondingly, r1 indicates a value of A1 that corresponds with a given digital value of D_d.

For a case in which A_out=A0+A1, the digital-to-analog ratio r1=the digital-to-analog ratio r0, and the filtered analog signal A_out is kept as a substantially constant value between successive samples of the digital signal D_in, an amplitude response of a transfer function of the device shown in FIG. 1a is:

$$A(f) = \sqrt{2 + 2\cos(2\pi f \times t_d)} \times \frac{\sin(\pi \times f / f_s)}{\pi \times f / f_s}, \quad (1)$$

where f is frequency, $t_d$ is a delay produced with the delay element 110, and $f_s$ is a frequency of a sample clock CLK_D of the digital signal D_in. The square root part of the amplitude response represents a FIR-filter (finite impulse response) that is realised with the device shown in FIG. 1a. The quotient part of the amplitude response is the SINC-function that comes from the fact that the filtered analog signal A_out is kept as a substantially constant value between successive samples of the digital signal D_in. The FIR-filter can be tuned to generate a spectral null at a desired frequency point by adjusting a temporal length of the delay $t_d$. For example, if $t_d=2$ clock cycles ($2/f_s$) of the sample clock CLK_D a spectral null is located at $f_s/4$.

Figure 1B:
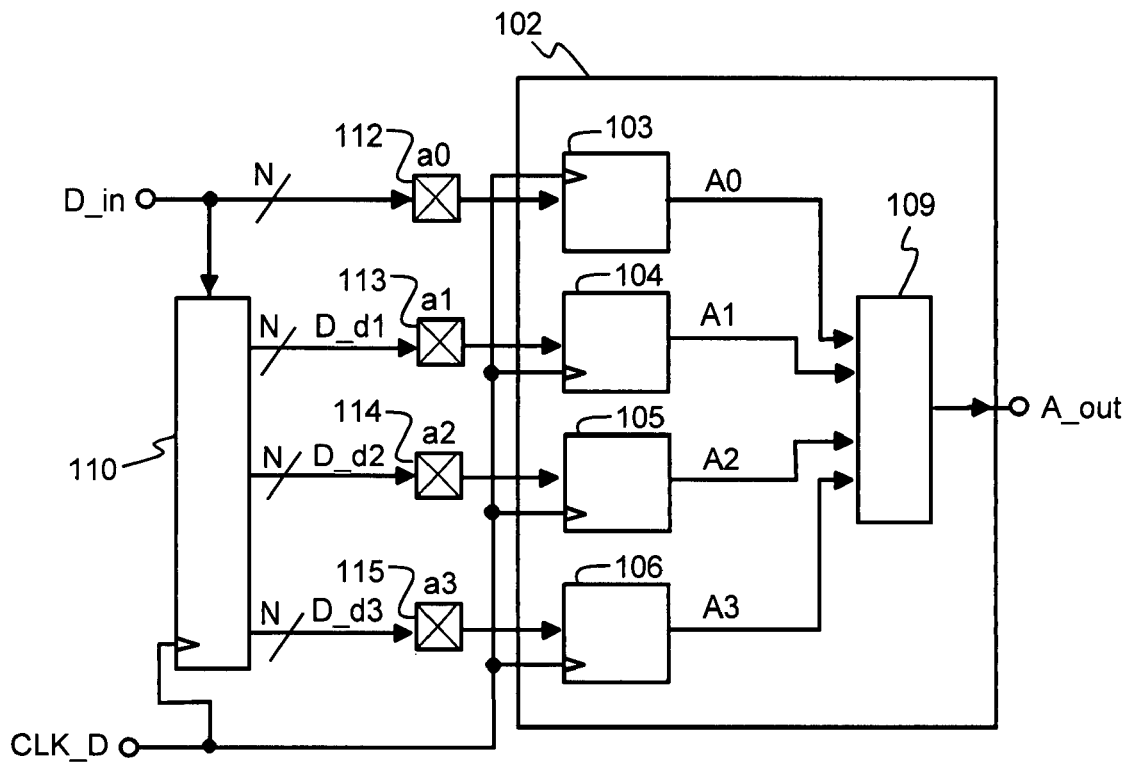

FIG. 1b shows a block diagram of a device according to an embodiment of the invention for converting a digital signal D_in having N data-bits into a filtered analog signal A_out. The device comprises a delay element 110 that is arranged to produce delayed versions D_d1, D_d2, and D_d3 of the digital signal D_in. A digital-to-analog conversion circuitry 102 comprises conversion elements 103, 104, 105, and 106 and a combination element 109. The conversion elements 103, 104, 105, and 106 are arranged to convert the digital signal D_in and the delayed versions D_d1, D_d2, and D_d3 of the digital signal into analog signals A0, A1, A2, and A3, respectively. The combination element 109 is arranged to produce the filtered analog signal A_out as a combination of the analog signals A0, A1, A2, and A3. The device shown in FIG. 1b comprises level adjustment elements 112-115 that can be used for modifying levels of the digital signal D_in and/or of the delayed versions D_d1, D_d2, and D_d3 of the digital signal. In the example situation shown in FIG. 1b, the level adjustment elements 112-115 are arranged to multiply the digital signal D_in and the delayed versions D_d1, D_d2, and D_d3 of the digital signal with factors a0, a1, a2, and a3, respectively.

In a device according to an embodiment of the invention the level adjustment elements 112-115 are level shifters. The level adjustment elements can be level shifters if the factors a0-a3 are integer powers of two ($2^Q$, Q is an integer number). For example, a division with $2^Q$ can be performed by adding Q copies of an MSB (most significant bit) above the original MSB of a digital value. In a device according to another embodiment of the invention the level adjustment elements 112-115 are digital multiplier elements.

A digital output value of a level adjustment element 112, 113, 114, or 115 has generally more data-bits than a digital input value of the level adjustment element. It may be, however, a too complex and expensive solution to build the conversion elements 103-104 to be able to handle all the data-bits of the digital output values of the level adjustment elements 112-115. Therefore, the digital output values of the digital level adjustment elements 112-115 are usually truncated from their LSB-ends (least significant bit). Truncation errors can be mitigated by building the conversion elements 103-106 to be able to include into a digital-to-analog conversion a most significant bit that is truncated out. It is also possible to provide a level adjustment element with a digital increment adder such that a most significant bit that is truncated out can be added to a least significant bit of a truncated digital value.

For a case in which A_out=A0+A1+A2+A3 and all the conversion elements 103-106 use a same digital-to-analog ratio, a frequency response of a FIR-filter that is realized with the device shown in FIG. 1b is:

$$F(f)=a0+a1\times e^{-j2\pi f t d1}+a2\times e^{-j2\pi f t d2}+a3\times e^{-j2\pi f t d3}, \quad (2)$$

where f is frequency, j is the imaginary unit, and $t_{d1}$-$t_{d3}$ are delays produced with the delay element 110. The delay element 110 can comprise, for example, a shift-register that is arranged to store and to delay the digital signal D_in for a predetermined number of clock cycles of the sample clock CLK_D of the digital signal D_in. The delayed versions D_d1, D_d2, and D_d3 of the digital signal can be taken out from different stages of the shift register.

Figure 2A:
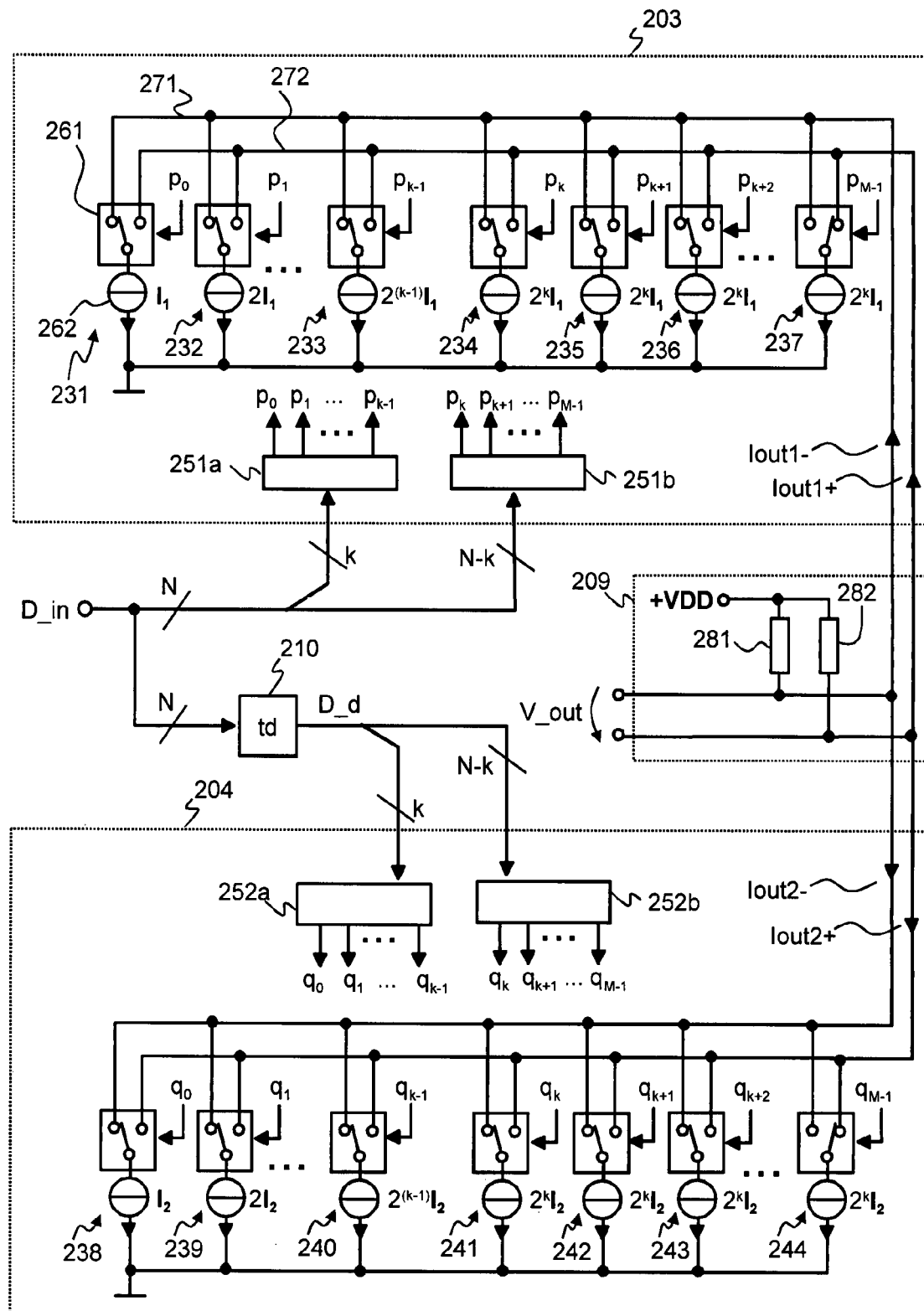
FIG. 2a shows a block diagram of a device according to an embodiment of the invention for converting a digital signal having a plurality of data-bits into a filtered analog signal.

FIG. 2a shows a block diagram of a device according to an embodiment of the invention for converting a digital signal D_in having N data-bits into a filtered analog signal that is represented by a voltage V_out. The device comprises a delay element 210 that is arranged to produce a delayed version D_d of the digital signal D_in. A digital-to-analog conversion circuitry comprises conversion elements 203 and 204 and a combination element 209. The conversion element 203 is arranged to convert the digital signal D_in into a first analog signal that is represented by electrical currents Iout1+ and Iout1−. The conversion element 204 is arranged to convert the delayed version D_d of the digital signal into a second analog signal that is represented by electrical currents Iout2+ and Iout2−. The combination element 209 is coupled to a supply voltage +VDD and is arranged to produce the voltage V_out with the aid of load resistors 281 and 282.

The conversion elements 203 and 204 are current steering digital-to-analog converters that are built with parallel conversion cells. The conversion element 203 comprises a first set of conversion cells 231-237 that are arranged to produce the first analog signal Iout1+, Iout1− and the conversion element 204 comprises a second set of conversion cells 238-244 that are arranged to produce the second analog signal Iout2+, Iout2−. Each conversion cell includes a current source and a selector switch that is arranged to control, according to a value of a relevant data-bit, a flowing path of an electrical current produced with the current source. For example, a conversion cell 231 comprises a current source 262 and a selector switch 261 that is arranged to determine whether the electrical current $I_1$ flows in a conductor 271 or in a conductor 272. The conversion elements 203 and 204 are presented in a segmented configuration, wherein an electrical current in an LSB-segment (least significant bits-segment) is generated with parallel binary weighted conversion cells whereas an electrical current in an MSB-segment (most significant bits-segment) is generated with unary coded conversion cells. The number of conversion cells of the LSB-segment is the number of bits handled with the LSB-segment. The number of conversion cells of the MSB-segment is $2^{N-k}-1$, where N−k is the number of bits handled with the MSB-segment. In FIG. 2a, conversion cells 231-233 that are arranged to generate electrical currents $I_1, 2I_1, \ldots, 2^{k-1}I_1$ belong to an LSB-segment of the conversion element 203 and conversion cells 234-237 that are arranged to generate electrical currents $2^k I_1, 2^k I_1, \ldots, 2^k I_1$ belongs to an MSB-segment of the conversion element 203. Correspondingly, conversion cells 238-240 that are arranged to generate electrical currents $I_2, 2I_2, \ldots, 2^{k-1}I_2$ belong to an LSB-segment of the conversion element 204 and conversion cells 241-244 that are arranged to generate electrical currents $2^k I_2, 2^k I_2, \ldots, 2^k I_2$ belongs to an MSB-segment of the conversion element 204. A value of the electrical current $I_1$ that corresponds with the LSB (least significant bit) of the digital signal D_in is inversely proportional to the digital-to-analog ratio of the conversion element 203 and a value of the electrical current $I_2$ that corresponds with the LSB of the delayed version D_d of the digital signal is inversely proportional to the digital-to-analog ratio of the conversion element 204. A mutual ratio of tap coefficients of a FIR-filter that is realised with the device shown in FIG. 2a can be adjusted by selecting suitable values for the electrical currents $I_1$ and $I_2$.

The conversion cells of the conversion element 203 are controlled with control quantities $p_0, p_1, \ldots, p_{M-1}$ (M=k+$2^{N-k}$-1) that are produced with logic elements 251a and 251b on the basis of data-bits $d_0, d_1, \ldots, d_{N-1}$ of the digital signal D_in. Depending on the type of the selector switches of the conversion cells the control quantities can be either electrical currents or voltages. The control quantities $p_0, p_1, \ldots, p_{M-1}$ can be produced for example in the following way: A control quantity $p_i$ (i=0, . . . , k−1) that is produced with the logic element 251a has a first predetermined voltage value $V_1$ when a data-bit $d_i$='0' and a second pre-determined voltage value $V_2$ when the data-bit $d_i$='1'. The first control quantity $p_k$ that is produced with the logic element 251b is $V_1$ when the data-bit $d_k$='0' and $V_2$ when the data-bit $d_k$='1'. The next two control quantities $p_{k+1}$ and $p_{k+2}$ are $V_1$ when the data-bit $d_{k+1}$='0' and $V_2$ when $d_{k+1}$='1'. The next four control quantities $p_{k+3} \ldots p_{k+6}$ are $V_1$ when the data-bit $d_{k+2}$='0' and $V_2$ when $d_{k+2}$='1'. The data-bit $d_{k+3}$ determines the next eight control quantities, the data data-bit $d_{k+4}$ determines the next 16 control quantities, etc. The conversion cells of the conversion element 204 are controlled with control quantities $q_0, q_1, \ldots, q_{M-1}$ that are produced with logic elements 252a and 252b on the basis of data-bits of the delayed version D_d of the digital signal. The control quantities $q_0, q_1, \ldots, q_{M-1}$ can be produced in the same way as the control quantities $p_0, p_1, \ldots, p_{M-1}$.

Figure 2B:
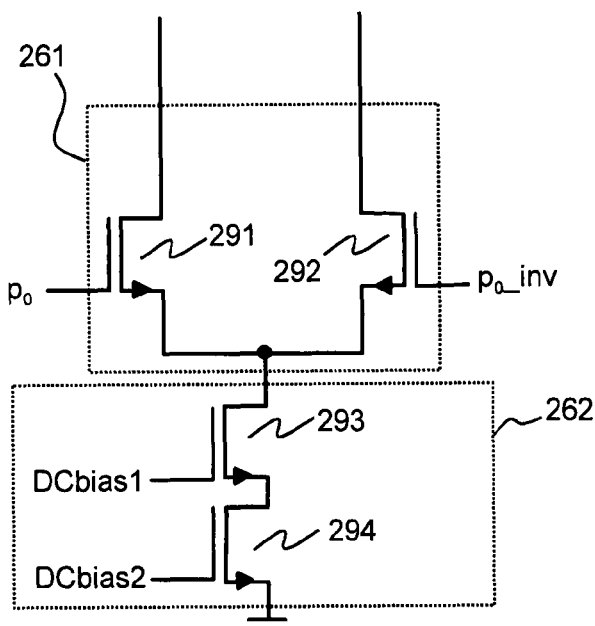

FIG. 2b shows a circuit diagram of a conversion cell that can be used in a device shown in FIG. 2a. The selector switch 261 of the conversion cell is realised with transistors 291 and 292 that are controlled with control voltages $p_0$ and $p_0\_inv$. The control voltage $p_0\_inv$ is a functional inversion of the control voltage $p_0$ in such a way that the transistor 291 is in a conducting state when the transistor 292 is in a non-conducting state and vice versa. The current source 262 is a cascode current source that is realised with transistors 293 and 294 that are biased with DC-bias voltages DCbias1 and DCbias2. It should be noted that the transistors depicted in FIG. 2b are MOS-transistors (metal oxide semiconductor), but any of them can be replaced with another type of transistor.

Figure 3B:
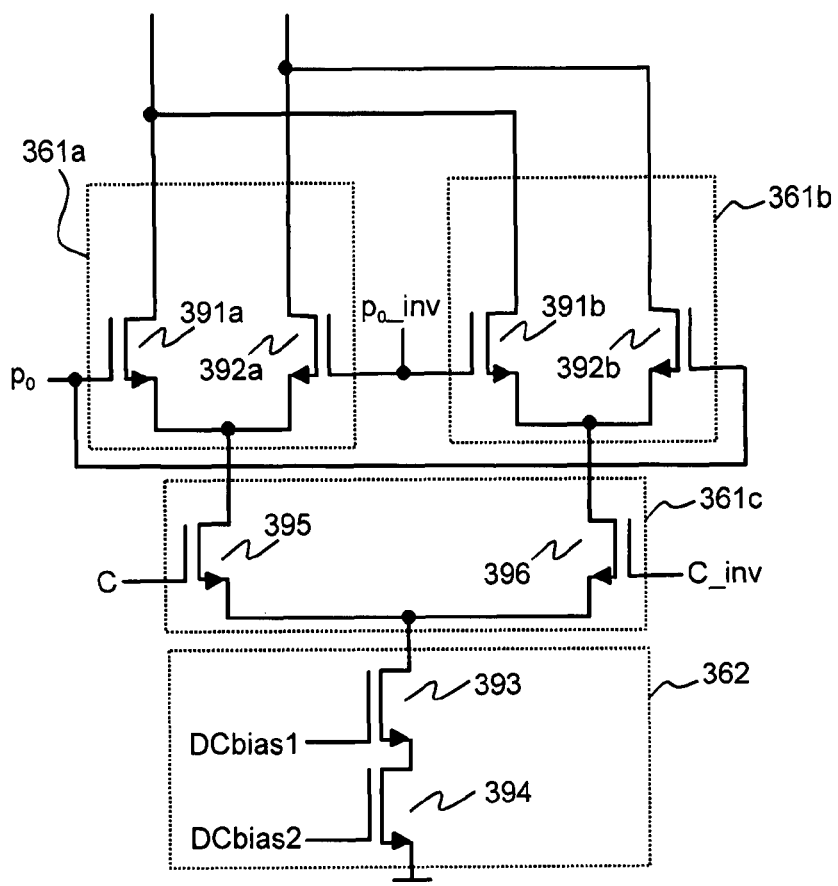
Figure 3A:
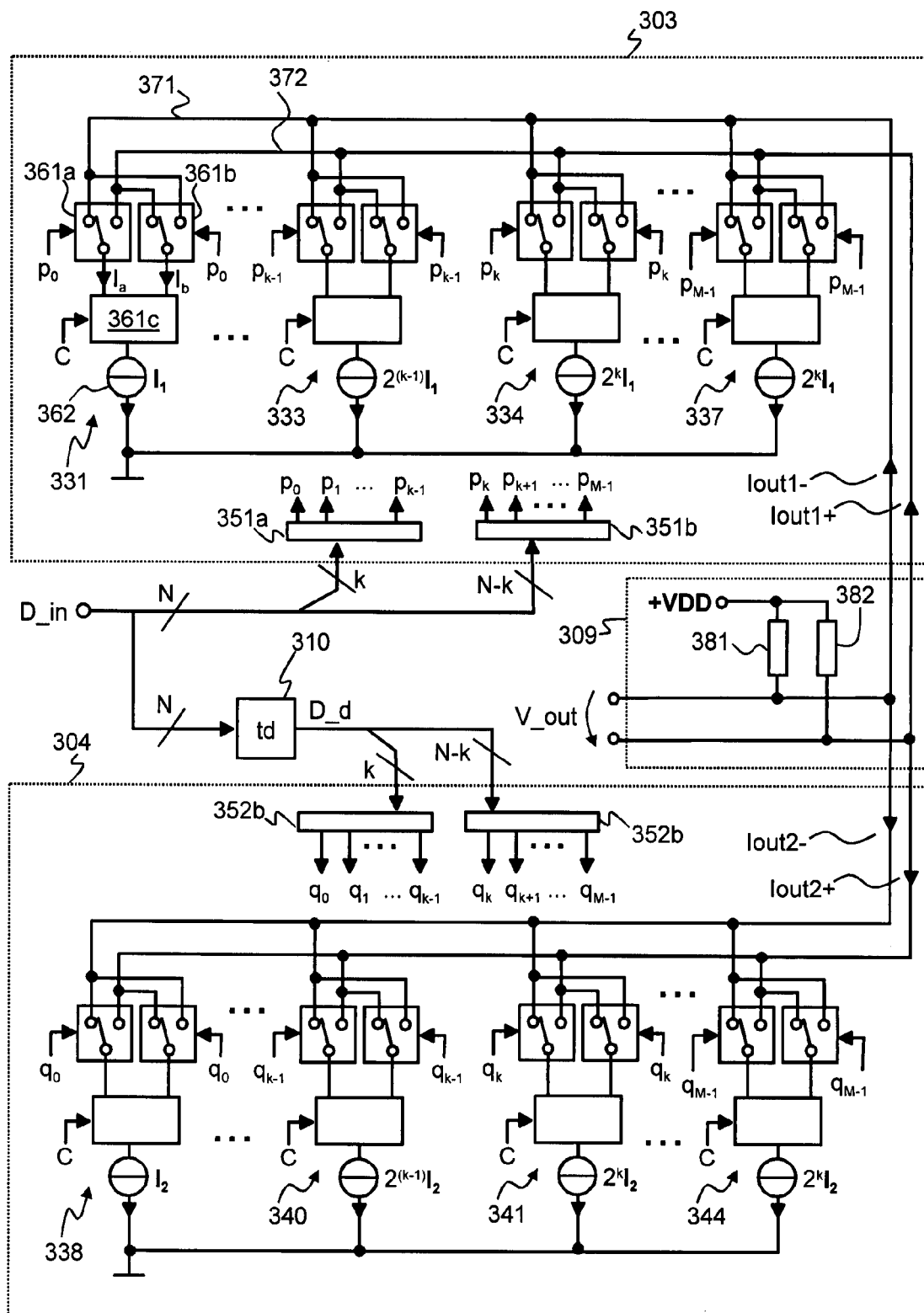
FIG. 3a shows a block diagram of a device according to an embodiment of the invention for converting a digital signal having a plurality of data-bits into a filtered analog signal.

FIG. 3a shows a block diagram of a device according to an embodiment of the invention for converting a digital signal D_in having N data-bits into a filtered analog signal that is represented by a voltage V_out. The device comprises a delay element 310 that is arranged to produce a delayed version D_d of the digital signal D_in. A digital-to-analog conversion circuitry comprises conversion elements 303 and 304 and a combination element 309. The conversion element 303 is arranged to convert the digital signal D_in into a first analog signal that is represented by electrical currents Iout1+ and Iout1−. The conversion element 304 is arranged to convert the delayed version D_d of the digital signal into a second analog signal that is represented by electrical currents Iout2+ and Iout2−. The combination element 309 is coupled to a supply voltage +VDD and is arranged to produce the voltage V_out with the aid of load resistors 381 and 382. In this embodiment of the invention the digital-to-analog conversion circuitry is arranged to perform not only digital-to-analog conversion but also modulation with a carrier signal C.

The conversion element 303 comprises a first set of conversion cells 331-337 that are arranged to produce the first analog signal Iout1+, Iout1− and the conversion element 304 comprises a second set of conversion cells 338-344 that are arranged to produce the second analog signal Iout2+, Iout2−. Each conversion cell includes a current source arranged to produce an electrical current, a pair of selector switches, and a current division switch. The current division switch is arranged to control, according to a value of the carrier signal C, distribution of the electrical current between the selector switches. The pair of selector switches is arranged to control, according to a value of a relevant data-bit, a flowing path of the electrical current. For example, a conversion cell 331 comprises a current source 362, selector switches 361a and 361b, and a current division switch 361c. The current source 362 is arranged to generate an electrical current $I_1$. The current division switch 361c is arranged to divide, according to the carrier signal C, the electrical current $I_1$ into component electrical currents $I_a$ and $I_b$. The selector switch 361a is arranged determine whether the electrical current $I_a$ flows in a conductor 371 or in a conductor 372. The selector switch 361b is arranged determine whether the electrical current $I_b$ flows in a conductor 371 or in a conductor 372.

In a case in which the carrier signal C is a two-valued signal and/or the current division switch 361c is actually a selector switch, the electrical current $I_1$ flows totally via the selector switch 361a ($I_a=I_1$, $I_b=0$) or totally via the selector switch 361b ($I_a=0$, $I_b=I1$). This kind of operation corresponds with modulation (mixing) with a square wave. Modulation with a general waveform of the carrier signal C is achieved, for example, when $I_a=I_1 \times C/C_{max}$ and $I_b=I_1 \times (1-C/C_{max})$, where $C_{max}$ is the maximum absolute value of the carrier signal C.

The conversion elements 303 and 304 are presented in a segmented configuration in the same way as in FIG. 2a. The conversion cells of the conversion element 303 are controlled with control quantities $p_0, p_1, \ldots, p_{M-1}$ (M=k+$2^{N-k}$-1) that are produced with logic elements 351a and 351b on the basis of data-bits of the digital signal D_in. The conversion cells of the conversion element 304 are controlled with control quantities $q_0, q_1, \ldots, q_{N-1}$ that are produced with logic elements 352a and 352b on the basis of data-bits of the delayed version D_d of the digital signal. A mutual ratio of tap coefficients of a FIR-filter that is realised with the device shown in FIG. 3a can be adjusted by selecting suitable values for the electrical currents $I_1$ and $I_2$.

FIG. 3b shows a circuit diagram of a conversion cell that can be used in a device shown in FIG. 3a. The selector switch 361a of the conversion cell is realised with transistors 391a and 392a that are controlled with control voltages $p_0$ and $p_0\_inv$, respectively. The selector switch 361b of the conversion cell is realised with transistors 391b and 392b that are controlled with control voltages $p_0\_inv$ and $p_0$, respectively. The control voltage $p_0\_inv$ is a functional inversion of the control voltage $p_0$ in such a way that the transistors 391a and 392b are in a conducting state when the transistors 392a and 391b are in a non-conducting state and vice versa. The current division switch 361c of the conversion cell is realised with transistors 395 and 396 that are controlled with the carrier signal C and a functional inversion C_inv of the carrier signal in such a way that a sum of electrical currents via the transistors 395 and 396 is substantially constant. The current source 362 is a cascode current source that is realised with transistors 393 and 394 that are biased with DC-bias voltages DCbias1 and DCbias2. It should be noted that the transistors depicted in FIG. 3b are MOS-transistors (metal oxide semiconductor), but any of them can be replaced with another type of transistor.

Figure 4:
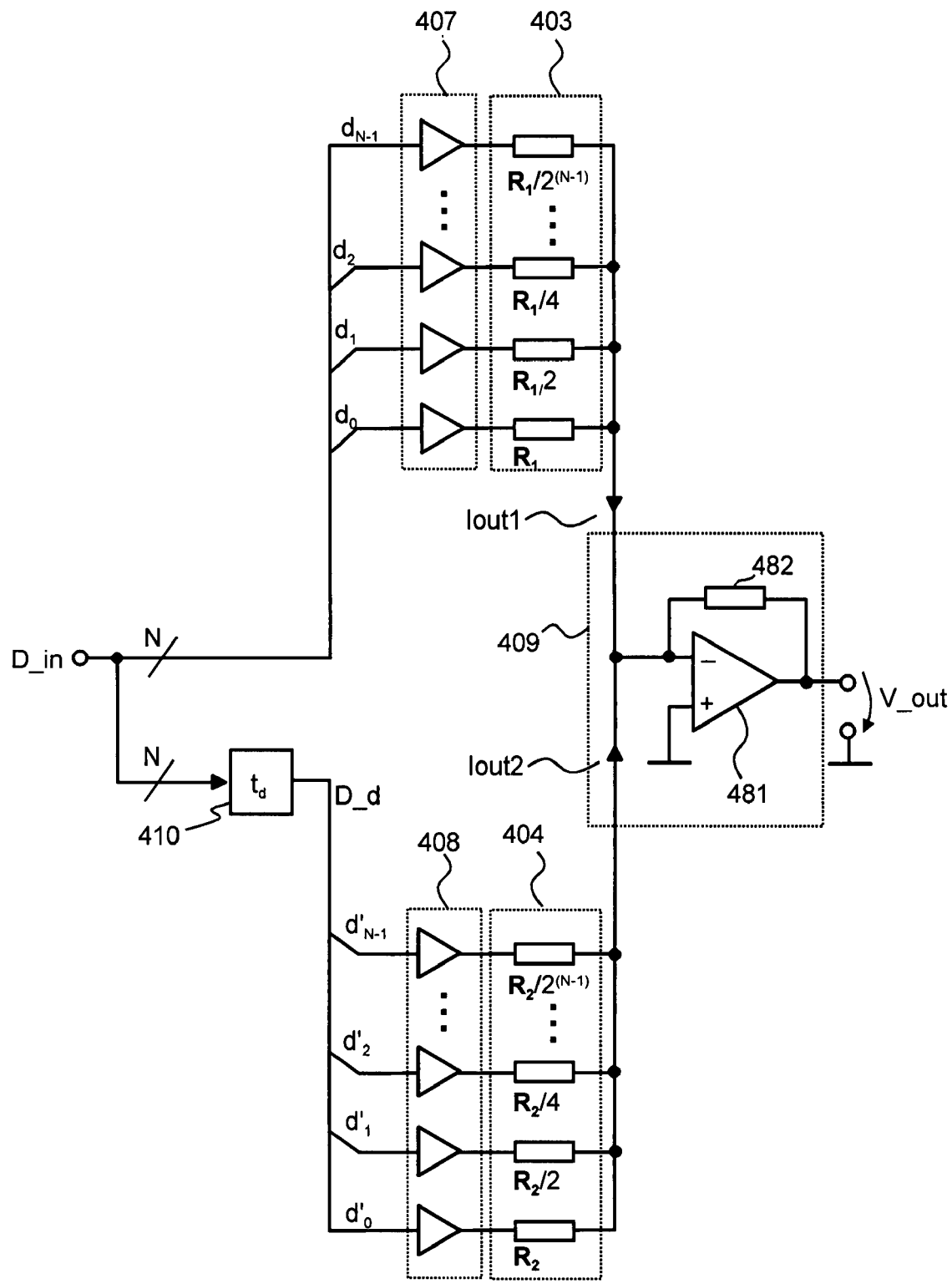
FIG. 4 shows a block diagram of a device according to an embodiment of the invention for converting a digital signal having a plurality of data-bits into a filtered analog signal.

FIG. 4 shows a block diagram of a device according to an embodiment of the invention for converting a digital signal D_in having N data-bits into a filtered analog signal that is represented by a voltage V_out. The device comprises a delay element 410 that is arranged to produce a delayed version D_d of the digital signal D_in. A digital-to-analog conversion circuitry comprises a first set of resistors 403 arranged to convert the digital signal D_in into a first analog signal that is represented by an electrical current Iout1. The digital-to-analog conversion circuitry comprises a second set of resistors 404 arranged to convert the delayed version D_d of the digital signal into a second analog signal that is represented by an electrical current Iout2. The digital-to-analog conversion circuitry comprises a combination element 409 that is arranged to produce the voltage V_out with the aid of an operational amplifier 481 and a resistor 482. The digital-to-analog conversion circuitry may comprise buffer amplifiers 407, 408 that are arranged to prevent a situation in which a source (not shown) of the digital signal D_in would be overloaded by the resistors 403, 404. Resistance values $R_1$, $R_1/2$, $R_1/4$, ..., $R_1/2^{(N-1)}$ of the resistors 403 are binary coded in such a way that electrical currents via the resistors 403 correspond with the weights of data-bits $d_0$, $d_1$, $d_2$, ..., $d_{N-1}$ of the digital signal D_in. Correspondingly, resistance values $R_2$, $R_2/2$, $R_2/4$, ..., $R_2/2^{(N-1)}$ of the resistors 404 are binary coded in such a way that electrical currents via the resistors 404 correspond with the weights of data-bits $d'_0$, $d'_1$, $d'_2$, ..., $d'_{N-1}$ of the delayed version D_d of the digital signal. The resistance value $R_1$ that corresponds with the LSB (least significant bit) $d_0$ of the digital signal D_in is proportional to a digital-to-analog ratio that relates to the conversion of the digital signal D_in. The resistance value $R_2$ that corresponds with the LSB $d'_0$ of the delayed version D_d of the digital signal is proportional to a digital-to-analog ratio that relates to the conversion of the delayed version D_d of the digital signal. A mutual ratio of tap coefficients of a FIR-filter that is realised with the device shown in FIG. 4 can be adjusted by selecting suitable resistance values $R_1$ and $R_2$.

Figure 5:
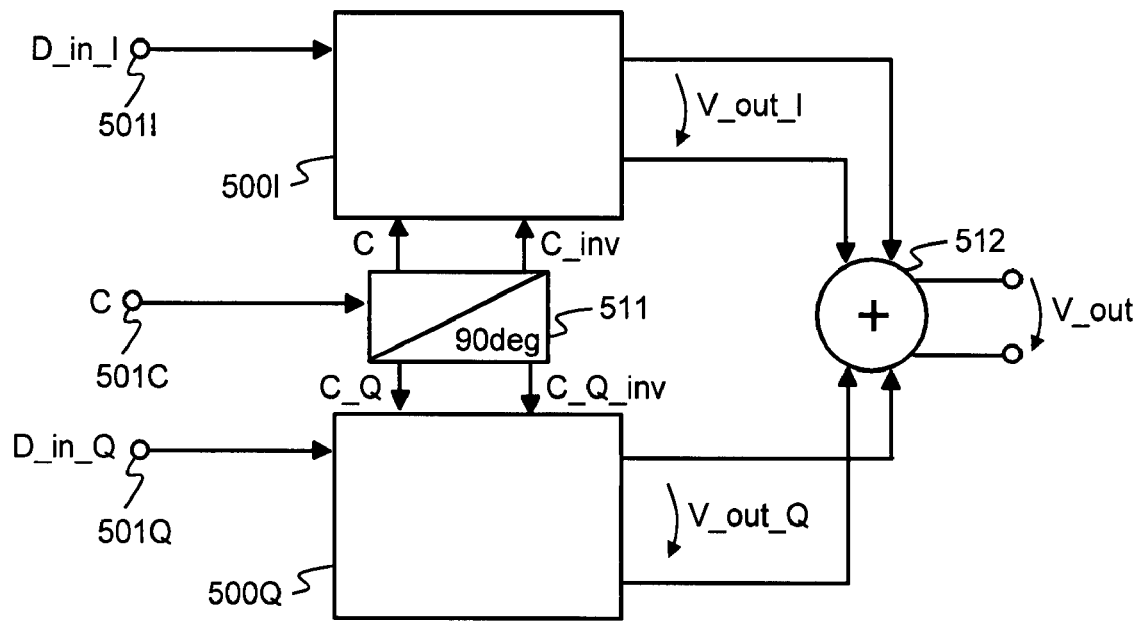
FIG. 5 shows a block diagram of a direct digital up-modulator having digital-to-analog conversion devices according to an embodiment of the invention.

FIG. 5 shows a block diagram of a direct digital up-modulator that comprises digital-to-analog conversion devices 500I and 500Q according to an embodiment of the invention. The direct digital up-modulator comprises a signal input interface 501I arranged to receive an in-phase digital signal D_in_I, a signal input interface 501Q arranged to receive a quadrature digital signal D_in_Q, and a signal input interface 501C arranged to receive a carrier signal C. The digital-to-analog conversion device 500I is arranged to convert and to modulate the in-phase digital signal D_in_I into an in-phase analog signal that is represented by a voltage V_out_I. The digital-to-analog conversion device 500Q is arranged to convert and to modulate the quadrature digital signal D_in_Q into a quadrature analog signal that is represented by a voltage V_out_Q. The digital-to-analog conversion devices 500I and 500Q can be, for example, similar to the device described in FIGS. 3a and 3b. The direct digital up-modulator comprises an inversion and phase shifting element 511 that is arranged to produce a ninety degrees phase lagging version C_Q of the carrier signal C and to produce functional inverses C_inv and C_Q_inv of the carrier signal and of the ninety degree phase lagging version of the carrier signal. The direct digital up-modulator comprises a superposition element 512 arranged to produce an up-modulated output signal that is represented by a voltage V_out as a superposition of the in-phase analog signal V_out_I and the quadrature analog signal V_out_Q. The in-phase/quadrature modulator architecture shown in FIG. 5 is able to suppress image components of the up-modulated output signal V_out.

Figure 6:
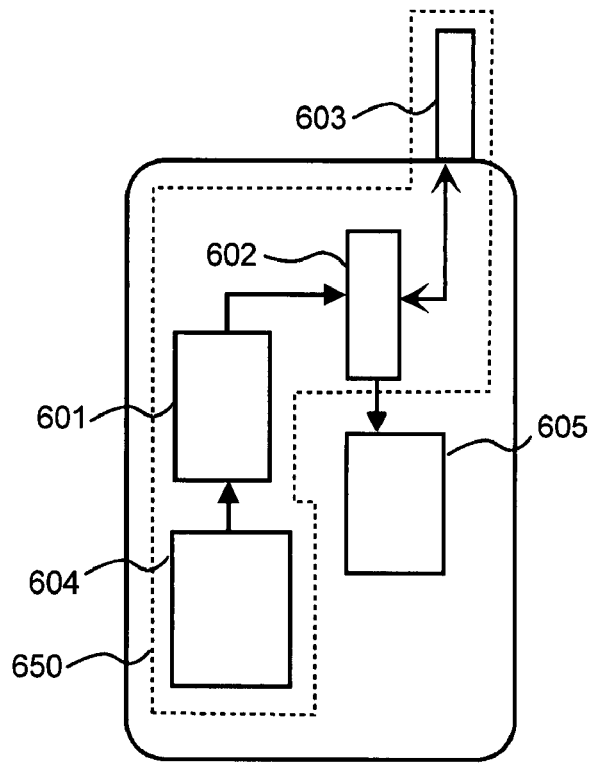
FIG. 6 shows a communication device according to an embodiment of the invention.

FIG. 6 shows a communication device according to an embodiment of the invention. A transmitter 650 of the communication device comprises a block 604 that is arranged to provide a digital transmission signal to a block 601 that is arranged to convert the digital transmission signal into a filtered and up-modulated analog signal. The block 604 can include means for producing the digital transmission signal, e.g. a microphone, an analog-to-digital converter, a codec, etc, and/or a digital input interface for receiving the digital transmission signal from an external source. The block 601 comprises a delay element and a digital-to-analog conversion circuitry. The delay element is arranged to produce a delayed version of the digital transmission signal. The digital-to-analog conversion circuitry is arranged to convert the digital transmission signal into a first analog signal, to convert the delayed version of the digital transmission signal into a second analog signal, and to produce a filtered analog signal as a combination of the first analog signal and the second analog signal. The digital-to-analog conversion circuitry may be arranged to perform up-modulation in conjunction with the digital-to-analog conversion. In this case, the filtered analog signal is also the filtered and up-modulated analog signal. The block 601 can comprise, for example, a direct digital up-modulator according to FIG. 5. As another alternative, the block 601 may comprise an analog up-modulator that is arranged to up-modulate the filtered-analog signal that is produced with the digital-to-analog conversion circuitry. The filtered and up-modulated analog signal is conducted from the block 601 to a block 602 that can comprise analog filters, a power amplifier, a duplexer, and an antenna front-end circuit. The block 602 is coupled to an antenna 603 and to a block 605 that represents parts of the communication device that are arranged to process a signal received from the antenna 603 via the duplexer and the antenna front-end circuit. The block 605 may include for example a demodulator, equalizers, filtering systems, controllers, a speaker, etc. The communication device can be e.g. a mobile phone, a base station of a cellular radio network, or a palmtop computer.

A set of integrated circuits according to an embodiment of the invention comprises one or more integrated circuits (IC) that comprise a signal input interface arranged to receive a digital signal, a delay element, and a digital-to-analog conversion circuitry. The delay element is arranged to produce a delayed version of the digital signal. The digital-to-analog conversion circuitry is arranged to convert the digital signal into a first analog signal, to convert the delayed version of the digital signal into a second analog signal, and to produce a filtered analog signal as a combination of the first analog signal and the second analog signal.

Figure 7:
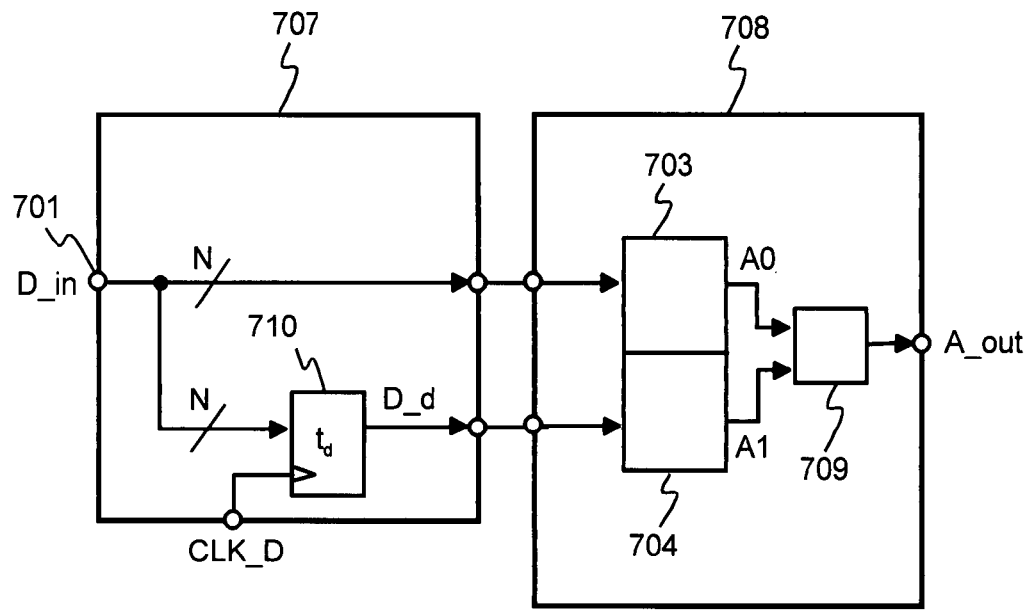
FIG. 7 shows a set of integrated circuits according to an embodiment of the invention.

An example of a set of integrated circuits according to an embodiment of the invention is shown in FIG. 7. This example of a set of integrated circuits comprises two integrated circuits 707 and 708. The integrated circuit 707 includes a signal input interface 701 for receiving a digital signal D_in and a delay element 710 arranged to produce a delayed version D_d of the digital signal. The integrated circuit 707 includes signal output interfaces via which the digital signal and the delayed version of the digital signal can be conducted to the integrated circuit 708. The integrated circuit 708 includes signal input interfaces for receiving the digital signal D_in and the delayed version of the digital signal D_d. The integrated circuit 708 includes a digital-to-analog conversion circuitry 703, 704, 709 that is arranged to convert the digital signal D_in into a first analog signal A0, to convert the delayed version D_d of the digital signal into a second analog signal A1, and to produce a filtered analog signal A_out as a combination of the first analog signal A0 and the second analog signal A1. It should be noted that the set of integrated circuits shown in FIG. 7 represents only one exemplifying way of allocating different functional elements into different integrated circuits.

Figure 8:
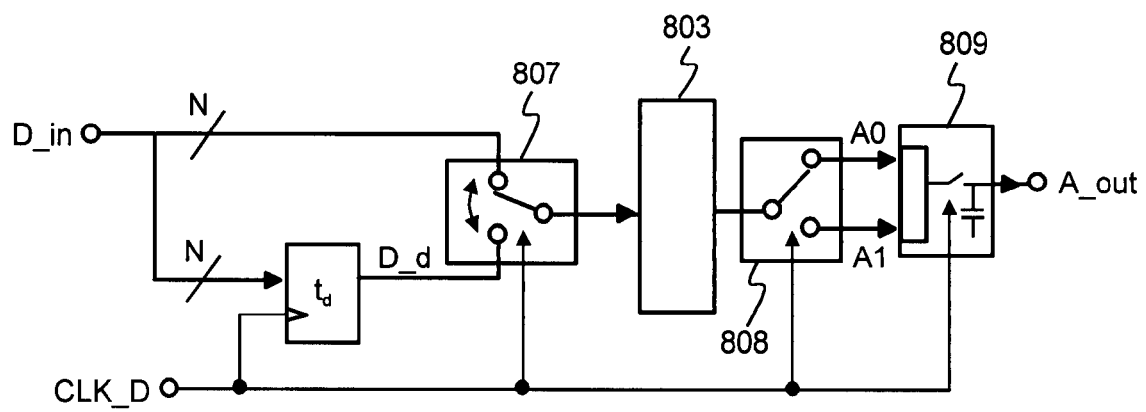
FIG. 8 shows a high level block diagram of a device according to an embodiment of the invention for converting a digital signal having a plurality of data-bits into a filtered analog signal.

FIG. 8 shows a high level block diagram of a device according to an embodiment of the invention for converting a digital signal D_in having N data-bits into a filtered analog signal A_out. The device is arranged to use a same conversion element 803 for converting the digital signal D_in into a first analog signal A0 and for converting a delayed version D_d of the digital signal into a second analog signal A1. The device shown in FIG. 8 represents a serial architecture whereas the devices shown e.g. in FIGS. 1a and 1b represent a parallel architecture. A selector switch 807 is arranged to connect the digital signal D_in to a signal input interface of the conversion element 803 during a first half-cycle of a sample clock CLK_D of the digital signal and to connect the delayed version D_d of the digital signal to the above-mentioned signal input interface during a second half-cycle of the sample clock. A selector switch 808 is arranged to connect a signal output interface of the conversion element 803 to a first signal input interface of a combination element 809 during the first half-cycle of the sample clock and to connect the signal output interface of the conversion element 803 to a second signal input interface of the combination element 809 during the second half-cycle of the sample clock. The combination element 809 comprises a latch circuitry that is arranged to prevent the filtered analog signal A_out from changing its value during the first half-cycle of the sample clock.

Figure 9:
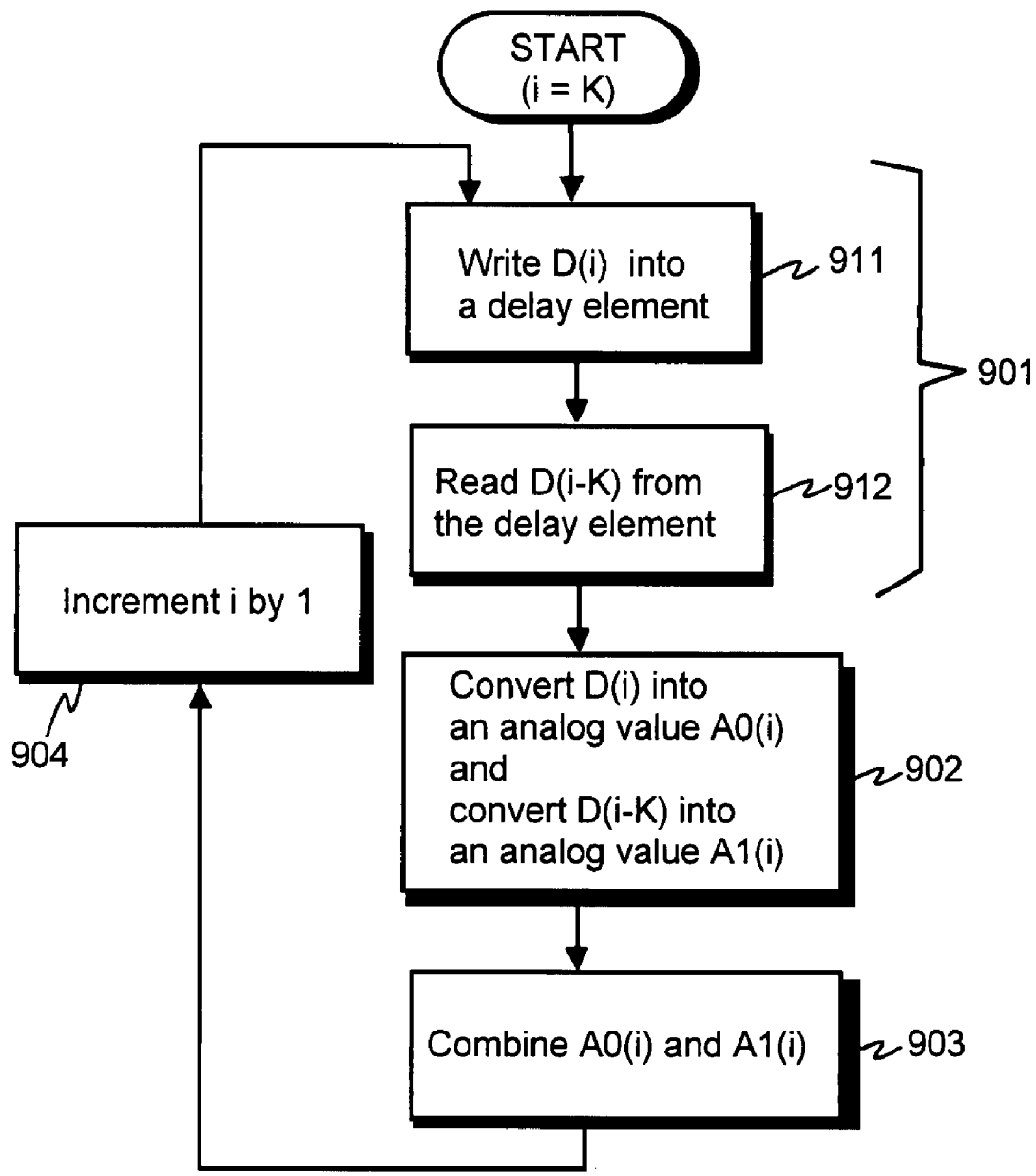
FIG. 9 shows a flow chart for a method according to an embodiment of the invention for converting a digital signal having a plurality of data-bits into a filtered analog signal.

FIG. 9 shows a flow chart for a method according to an embodiment of the invention for converting a digital signal having a plurality of data-bits into a filtered analog signal. D(i) and D(i−K) represent samples of the digital signal and the delayed version of the digital signal, respectively. Integer i is a number of the sample of the digital signal and integer K indicates the temporal length of the delay as clock cycles of a sample clock of the digital signal. In a phase 901, a delayed version of the digital signal is produced. In a sub-phase 911, the sample D(i) of the digital signal is written into a delay element. In a sub-phase 912, the sample D(i−K) of the delayed version of the digital signal is read out from the delay element. In phase 902, the sample D(i) of the digital signal is converted into a first analog signal value A0(i) and the sample D(i−K) of the delayed version of the digital signal is converted into a second analog signal value A1(i). In phase 903, a value of the filtered analog signal is produced as a combination of the first analog signal value A0(i) and the second analog signal value A1(i). Phase 904 illustrates the fact that phases 901, 902, and 903 are repeated for the next samples of the digital signal and the delayed version of the digital signal. In the embodiment of the invention described above and in FIG. 9, the production 901 of the delayed version of the digital signal does not comprise operations like level shifting, multiplication, or digital filtering. In this case, the digital data that is written to the delay element is D(i) and the digital data that is read out from the delay element is D(i−K). In a general case, the delayed version of the digital signal that is converted into a second analog signal may be not only delayed but also otherwise modified with respect to the digital signal that is converted into the first analog signal.

In a method according to an embodiment of the invention the first analog signal is produced with a first set of conversion cells and the second analog signal is produced with a second set of conversion cells. Each conversion cell includes a current source and a selector switch that is arranged to control, according to a value of a relevant data-bit, a flowing path of an electrical current produced with the current source.

In a method according to an embodiment of the invention the first analog signal is produced with a first set of conversion cells and the second analog signal is produced with a second set of conversion cells. Each conversion cell includes a current source arranged to produce an electrical current, a pair of selector switches, and a current division switch that is arranged to control, according to a value of a carrier signal, distribution of the electrical current between the selector switches. The pair of the selector switches are arranged to control, according to a value of relevant data-bit, a flowing path of the electrical current.

In a method according to an embodiment of the invention the digital signal is converted into the first analog signal with a first set of resistors and the delayed version of the digital signal is converted into the second analog signal with a second set of resistors.

A method according to an embodiment of the invention comprises at least one of the following: modifying a level of the digital signal with a first level shifter and modifying a level of the delayed version of the digital signal with a second level shifter.

A method according to an embodiment of the invention comprises at least one of the following: multiplying the digital signal with a first coefficient and multiplying the delayed version of the digital signal with a second coefficient.

In a method according to an embodiment of the invention the digital signal is converted into the first analog signal using a first digital-to-analog ratio and the delayed version of the digital signal is converted into the second analog signal using a second digital-to-analog ratio.

In a method according to an embodiment of the invention the delayed version of the digital signal is produced with a shift-register arranged to store and to delay the digital signal for a predetermined number of clock cycles of the sample clock of the digital signal.

In a method according to an embodiment of the invention at least two differently delayed versions of said digital signal are produced, said at least two differently delayed versions of said digital signal are converted into at least two second analog signals, and the filtered analog signal is produced as a combination of said first analog signal and said at least two second analog signals. A method according to this embodiment on the invention can be in use e.g. in the device shown in FIG. 1b.

While there have been shown and described and pointed out fundamental novel features of the invention as applied to embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. The specific examples provided in the description given above should not be construed as limiting. Therefore, the invention is not limited merely to the embodiments described above, many variants being possible without departing from the scope of the inventive idea defined in the independent claims.

What is claimed is:

1. An apparatus comprising:
    a delay element arranged to produce a delayed version of a digital signal having a plurality of first data-bits, the delayed version having a same number of second data-bits as a number of first data-bits, the delay element arranged to delay each of the second data bits by a same amount; and at least one of the following: a first level shifter arranged to modify a level of said digital signal and a second level shifter arranged to modify a level of said delayed version of said digital signal; and a digital-to-analog conversion circuitry arranged to convert said digital signal into a first analog signal, to convert said delayed version of said digital signal into a second analog signal, and to produce a filtered analog signal as a combination of said first analog signal and said second analog signal;

wherein the digital-to-analog conversion circuitry comprises a first set of conversion cells arranged to produce said first analog signal and a second set of conversion cells arranged to produce said second analog signal, each conversion cell including a current source arranged to produce an electrical current, a pair of selector switches, and a current division switch that is arranged to control, according to a value of a carrier signal, distribution of the electrical current between the selector switches, the pair of selector switches being arranged to control, according to a value of a data-bit, a flow path of the electrical current.

2. An apparatus according to claim 1, further comprising at least one of the following: a first digital multiplier element arranged to modify the level of said digital signal and a second digital multiplier element arranged to modify the level of said delayed version of said digital signal.

3. An apparatus according to claim 1, wherein the digital-to-analog conversion circuitry is arranged to convert said digital signal into said first analog signal with a first digital-to-analog ratio and to convert of said delayed version of said digital signal into said second analog signal with a second digital-to-analog ratio.

4. An apparatus according to claim 1, wherein the delay element comprises a shift-register arranged to store and to delay said digital signal for a predetermined number of clock cycles of a sample clock of said digital signal.

5. An apparatus according to claim 1, wherein the delay element is arranged to produce at least two differently delayed versions of said digital signal and the digital-to-analog conversion circuitry is arranged to convert said at least two differently delayed versions of said digital signal into at least two second analog signals, and to produce the filtered analog signal as a combination of said first analog signal and said at least two second analog signals.

6. An apparatus, comprising:
a delay element arranged to produce a delayed version of a digital signal having a plurality of first data-bits, the delayed version having a same number of second data-bits as a number of first data-bits, the delay element arranged to delay each of the second data bits by a same amount;

at least one of the following: a first digital multiplier element arranged to modify a level of said digital signal and a second digital multiplier element arranged to modify the level of said delayed version of said digital signal; and a digital-to-analog conversion circuitry arranged to convert said digital signal into a first analog signal, to convert said delayed version of said digital signal into a second analog signal, and to produce a filtered analog signal as a combination of said first analog signal and said second analog signal;

wherein the digital-to-analog conversion circuitry comprises a first set of conversion cells arranged to produce said first analog signal and a second set of conversion cells arranged to produce said second analog signal, each conversion cell including a current source arranged to produce an electrical current, a pair of selector switches, and a current division switch that is arranged to control, according to a value of a carrier signal, distribution of the electrical current between the selector switches, the pair of selector switches being arranged to control, according to a value of a data-bit, a flow path of the electrical current.

7. An apparatus according to claim 6, wherein the apparatus is one of the following: a mobile phone, a base station of a cellular radio network, and a palmtop computer.

8. A set of integrated circuits for converting a digital signal having a plurality of first data-bits into a filtered analog signal, the set of integrated circuits comprising the following elements realized in one or more integrated circuits:

a signal input interface arranged to receive said digital signal, a delay element arranged to produce a delayed version of said digital signal, the delayed version having a same number of second data-bits as a number of first data-bits, the delay element arranged to delay each of the second data bits by a same amount;

at least one of the following: a first level shifter arranged to modify a level of said digital signal and a second level shifter arranged to modify a level of said delayed version of said digital signal; and a digital-to-analog conversion circuitry arranged to convert said digital signal into a first analog signal, to convert said delayed version of said digital signal into a second analog signal, and to produce the filtered analog signal as a combination of said first analog signal and said second analog signal;

wherein the digital-to-analog conversion circuitry comprises a first set of conversion cells arranged to produce said first analog signal and a second set of conversion cells arranged to produce said second analog signal, each conversion cell including a current source arranged to produce an electrical current, a pair of selector switches, and a current division switch that is arranged to control, according to a value of a carrier signal, distribution of the electrical current between the selector switches, the pair of selector switches being arranged to control, according to a value of a data-bit, a flow path of the electrical current.

9. A method comprising:
producing from a digital signal having a plurality of first data-bits a delayed version of said digital signal, the delayed version having a same number of second data-bits as a number of first data-bits, the delay element arranged to delay each of the second data bits by a same amount, at least one of the following: modifying a level of said digital signal with a first level shifter and modifying a level of said delayed version of the digital signal with a second level shifter, converting said digital signal into a first analog signal,
converting said delayed version of said digital signal into a second analog signal, and producing a filtered analog signal as a combination of said first analog signal and said second analog signal;

wherein the steps of converting and producing use digital-to-analog conversion circuitry that comprises a first set of conversion cells arranged to produce said first analog signal and a second set of conversion cells arranged to produce said second analog signal, each conversion cell including a current source arranged to produce an electrical current, a pair of selector switches, and a current division switch that is arranged to control, according to a value of a carrier signal, distribution of the electrical current between the selector switches, the pair of selector switches being arranged to control, according to a value of a data-bit, a flow path of the electrical current.

10. A method according to claim 9, comprising at least one of the following:
multiplying said digital signal with a first coefficient and multiplying said delayed version of said digital signal with a second coefficient.

11. A method according to claim 9, wherein said digital signal is converted into said first analog signal using a first digital-to-analog ratio and said delayed version of said digital signal is converted into said second analog signal using a second digital-to-analog ratio.

12. A method according to claim 9, wherein said delayed version of said digital signal is produced with a shift-register arranged to store and to delay said digital signal for a predetermined number of clock cycles of a sample clock of said digital signal.

13. A method according to claim 9, wherein at least two differently delayed versions of said digital signal are produced, said at least two differently delayed versions of said digital signal are converted into at least two second analog signals, and the filtered analog signal is produced as a combination of said first analog signal and said at least two second analog signals.

14. An apparatus comprising:
a delay element arranged to produce a delayed version of a digital signal having a plurality of first data bits, the delayed version having a same number of second data-bits as a number of first data-bits, the delay element arranged to delay each of the second data bits by a same amount, and
digital-to-analog conversion circuitry comprising a first set of conversion cells arranged to produce a first analog signal from the first data bits and a second set of conversion cells arranged to produce a second analog signal from the second data bits, and a combination element configured to combine the first analog signal and the second analog signal into an output analog signal, each conversion cell including a current source and at least one selector switch that is arranged to control, according to a value of a data-bit, a flowing path of an electrical current produced with the current source, wherein the current sources for the first set of conversion cells are based on a first current and wherein the current sources for the second set of conversion cells are based on a second current.

15. An apparatus according to claim 14, wherein the at least one selector switch for each conversion cell comprises a single selection switch.

16. An apparatus according to claim 14, wherein the at least one selector switch for each conversion cell comprises a pair of selection switches, and each conversion cell further comprises a current division switch that is arranged to control, according to a value of a carrier signal, distribution of the electrical current between the pair of selector switches.

17. An apparatus according to claim 14, wherein the apparatus is one of the following: a mobile phone, a base station of a cellular radio network, or a palmtop computer.

18. An apparatus according to claim 14, wherein a temporal length of the delay is set to a predetermined value to generate a spectral null at a predetermined frequency point.

19. An apparatus according to claim 14, wherein values of the first current and the second current are set to predetermined values to set a mutual ratio to a predetermined mutual ratio, the mutual ratio of tap coefficients of a finite impulse response filter that is realised with the digital-to-analog conversion circuitry.

* * * * *